(12) United States Patent
Chen et al.

(10) Patent No.: US 8,274,133 B2
(45) Date of Patent: Sep. 25, 2012

(54) SEMICONDUCTOR PACKAGE AND METHOD FOR MAKING THE SAME

(75) Inventors: Chien-Hua Chen, Kaohsiung (TW); Teck-Chong Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 124 days.

(21) Appl. No.: 12/821,800

(22) Filed: Jun. 23, 2010

(65) Prior Publication Data

US 2011/0156247 A1    Jun. 30, 2011

(30) Foreign Application Priority Data

Dec. 31, 2009 (TW) ................. 98146114 A

(51) Int. Cl.
*H01L 23/02* (2006.01)
(52) U.S. Cl. ........ 257/528; 257/531; 257/532; 257/686; 257/758; 257/787; 257/E23.008
(58) Field of Classification Search .................. 257/379, 257/516, 528, 531, 532, 310, 686, 758, 787, 257/E23.008
See application file for complete search history.

(56) References Cited

U.S. PATENT DOCUMENTS

| 6,962,872 | B2 | 11/2005 | Chudzik et al. |
| 7,030,481 | B2 | 4/2006 | Chudzik et al. |
| 7,075,167 | B2 | 7/2006 | Harris et al. |
| 7,381,607 | B2 * | 6/2008 | Harris et al. ............... 438/210 |
| 2011/0156247 | A1 * | 6/2011 | Chen et al. ............... 257/724 |

* cited by examiner

*Primary Examiner* — Jack Chen
(74) *Attorney, Agent, or Firm* — McCracken & Frank LLC

(57) ABSTRACT

The present invention relates to a semiconductor package and a method for making the same. The semiconductor package comprises a substrate, a first metal layer, a first dielectric layer, a first upper electrode, a first protective layer, a second metal layer and a second protective layer. The substrate has at least one via structure. The first metal layer is disposed on a first surface of the substrate, and comprises a first lower electrode. The first dielectric layer is disposed on the first lower electrode. The first upper electrode is disposed on the first dielectric layer, and the first upper electrode, the first dielectric layer and the first lower electrode form a first capacitor. The first protective layer encapsulates the first capacitor. The second metal layer is disposed on the first protective layer, and comprises a first inductor. The second protective layer encapsulates the first inductor. Whereby, the first inductor, the first capacitor and the via structure are integrated into the semiconductor package, so that the size of the product is reduced.

13 Claims, 21 Drawing Sheets

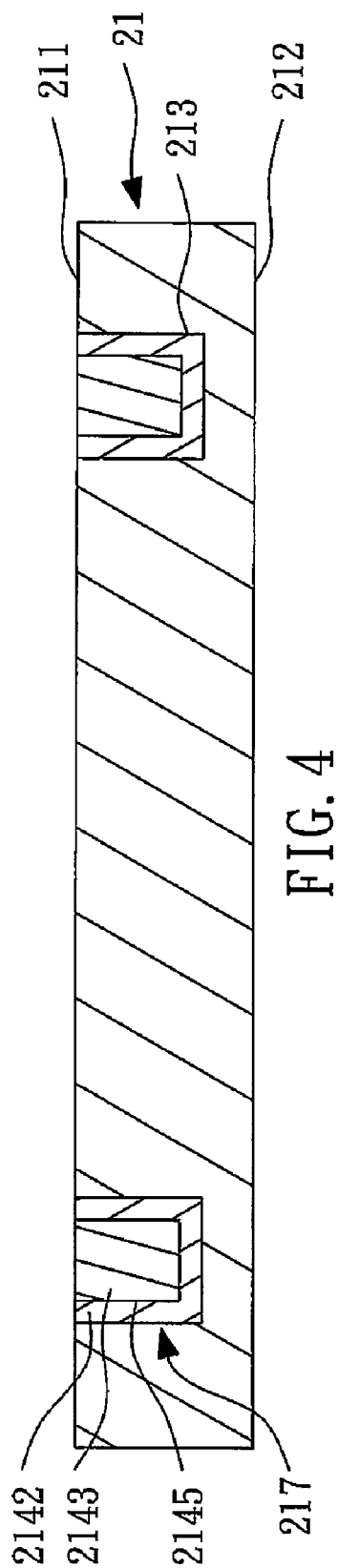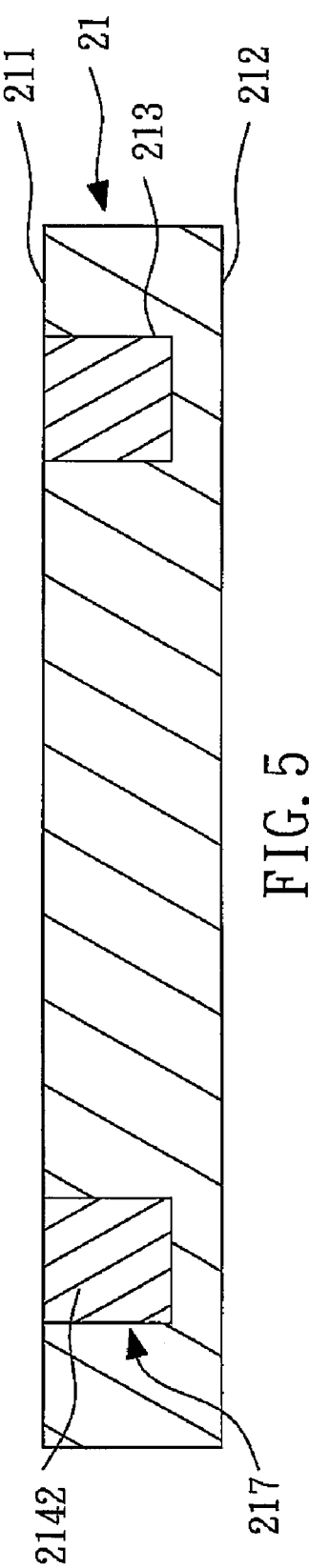

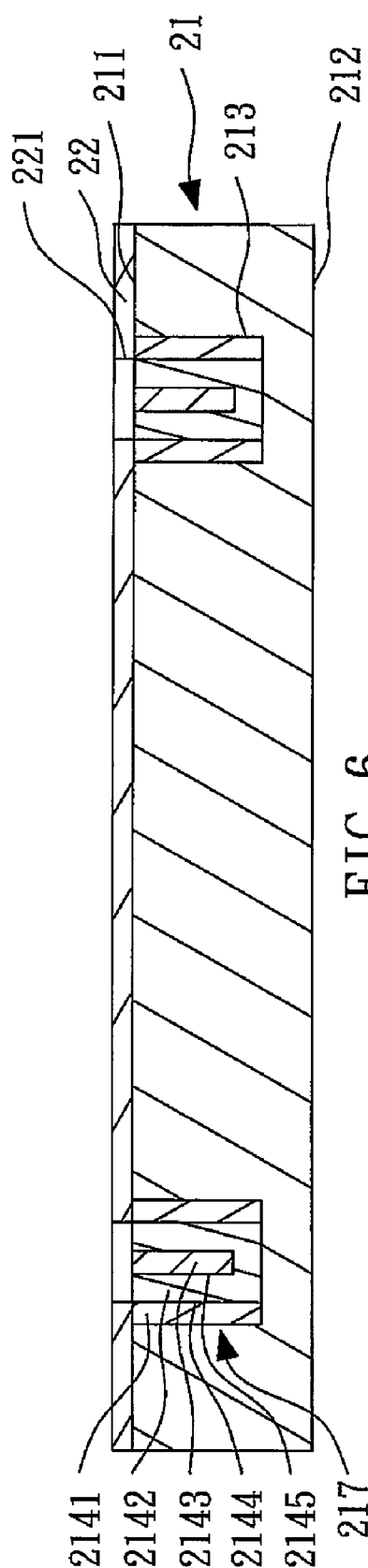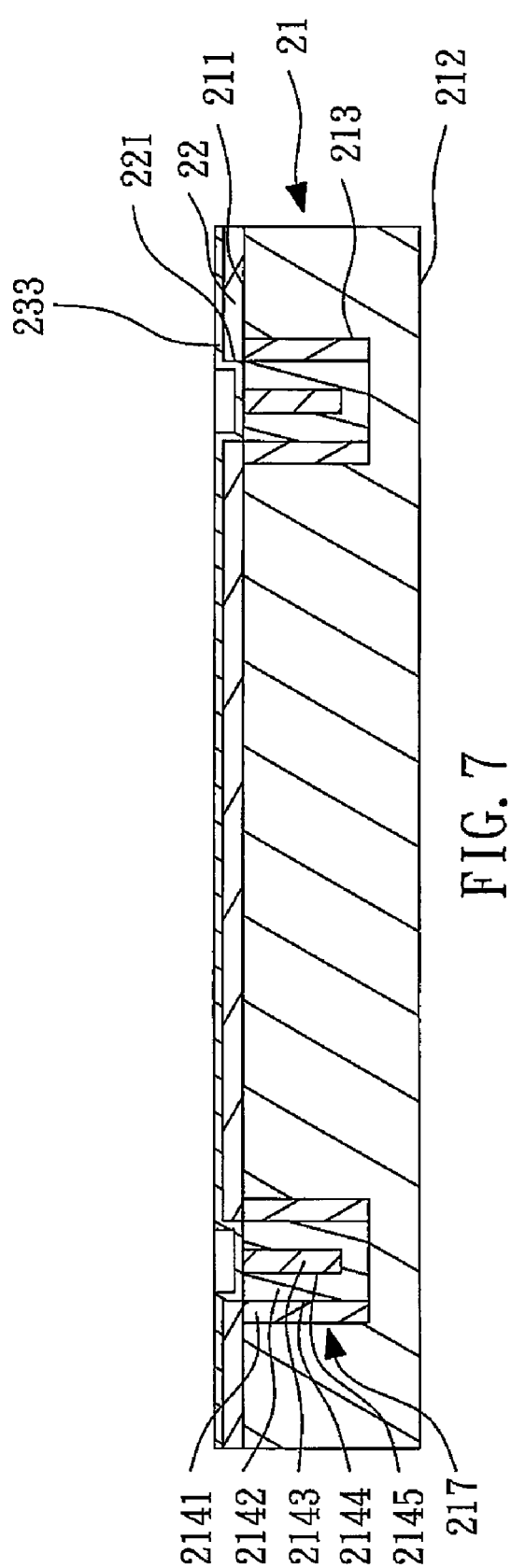

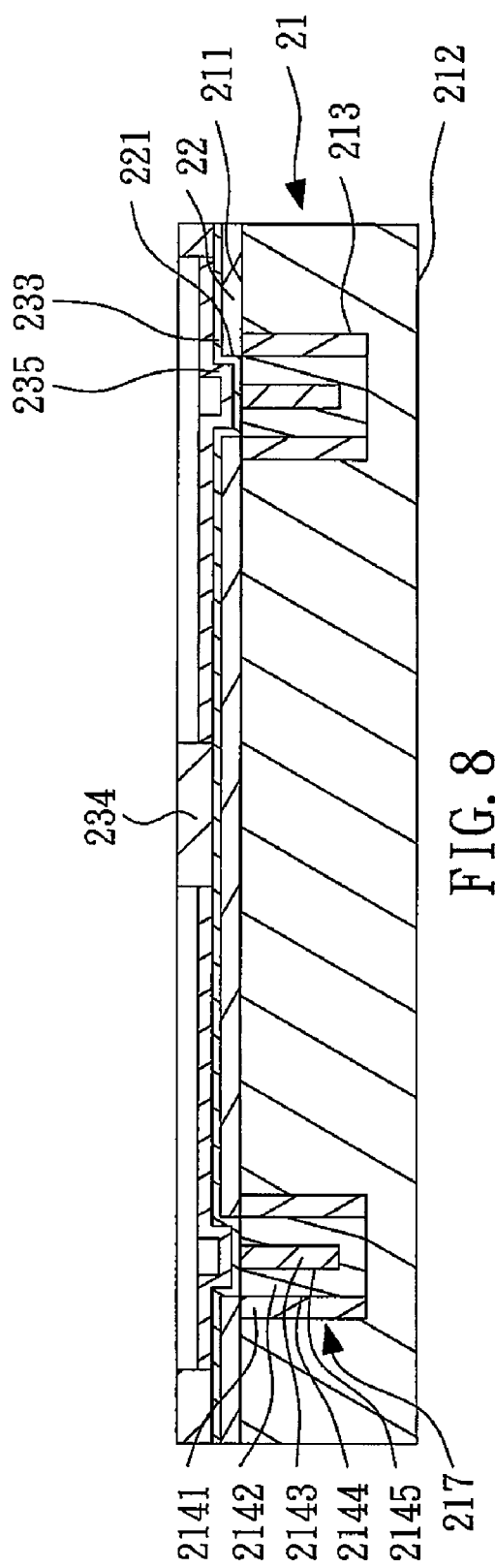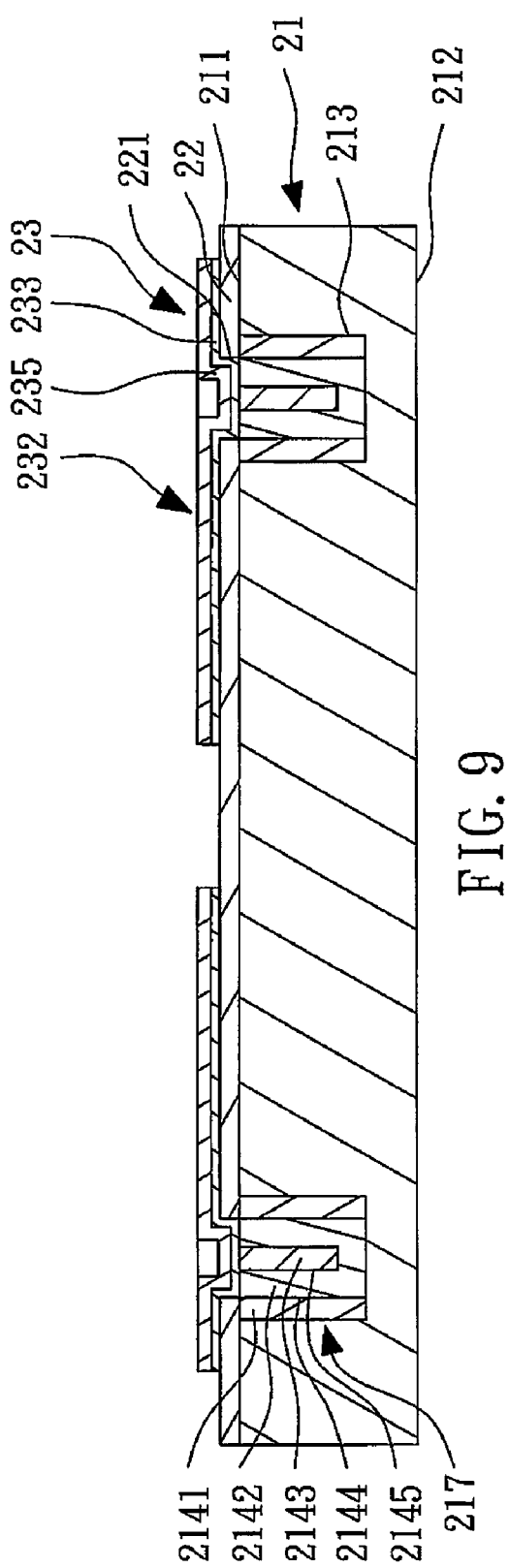

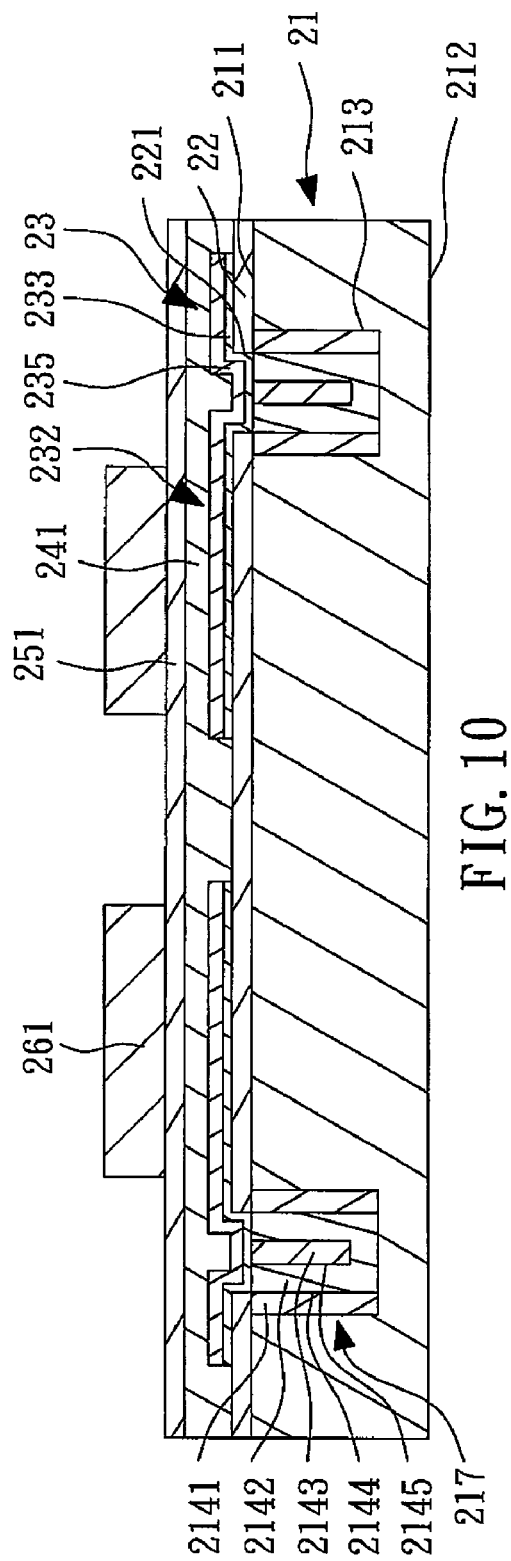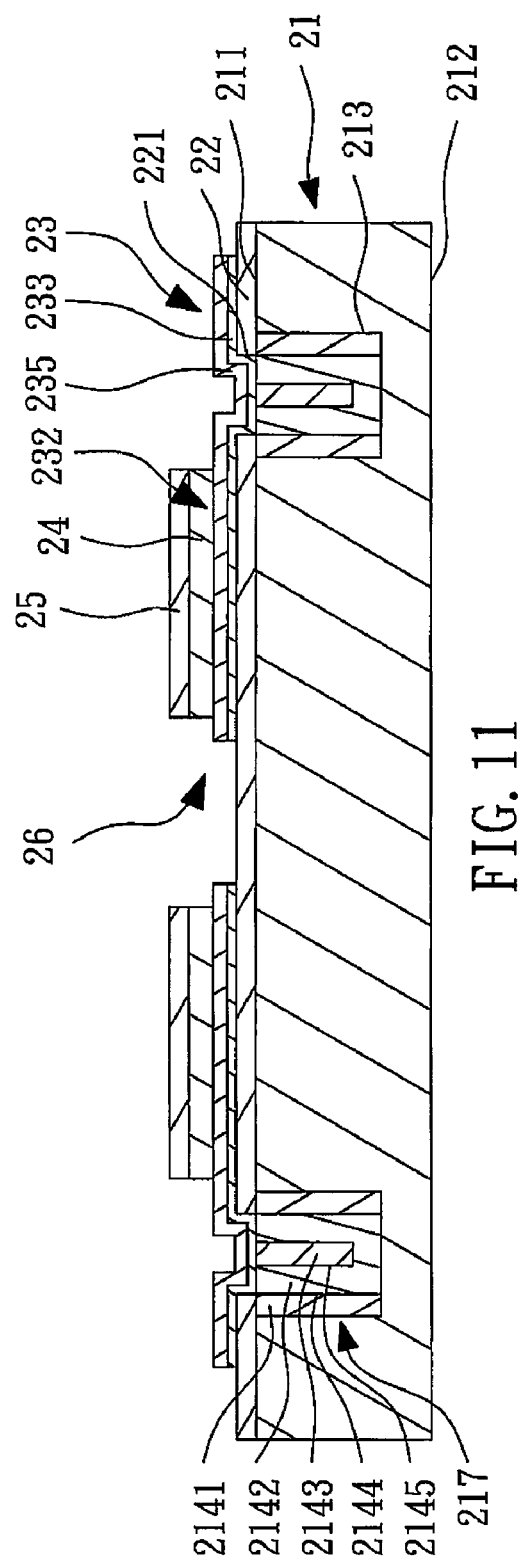

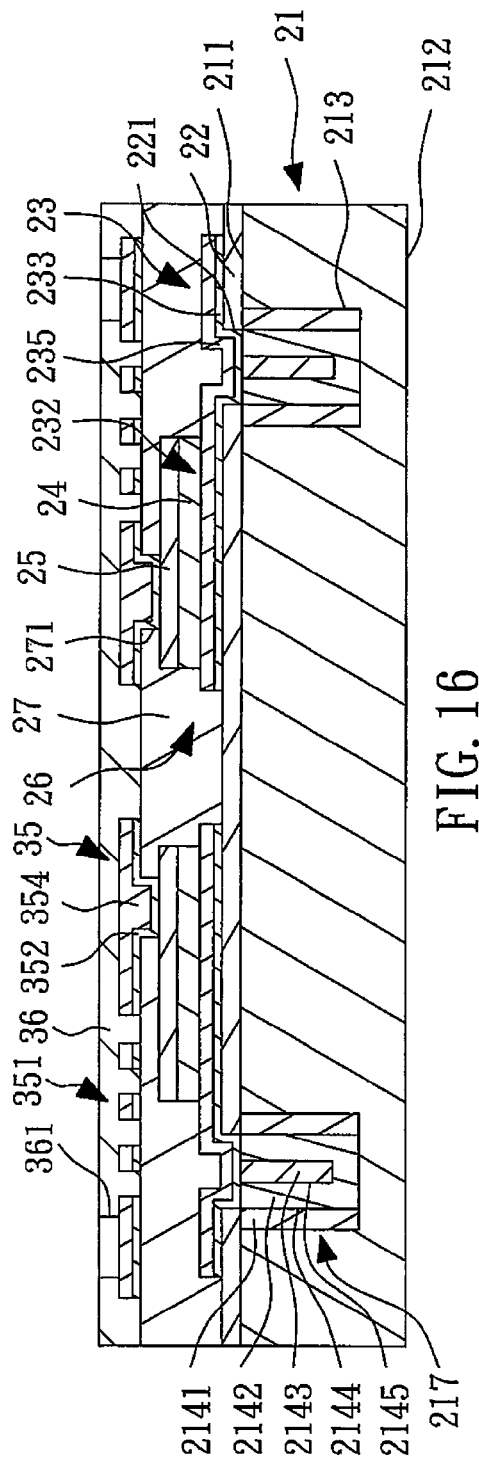
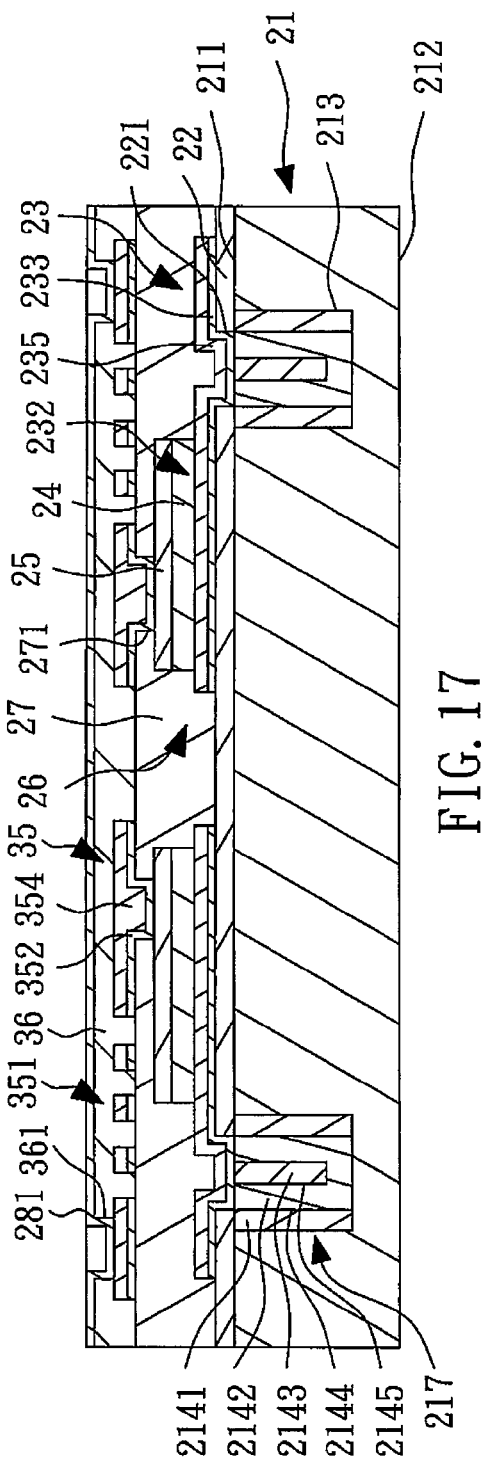
FIG. 16
FIG. 17

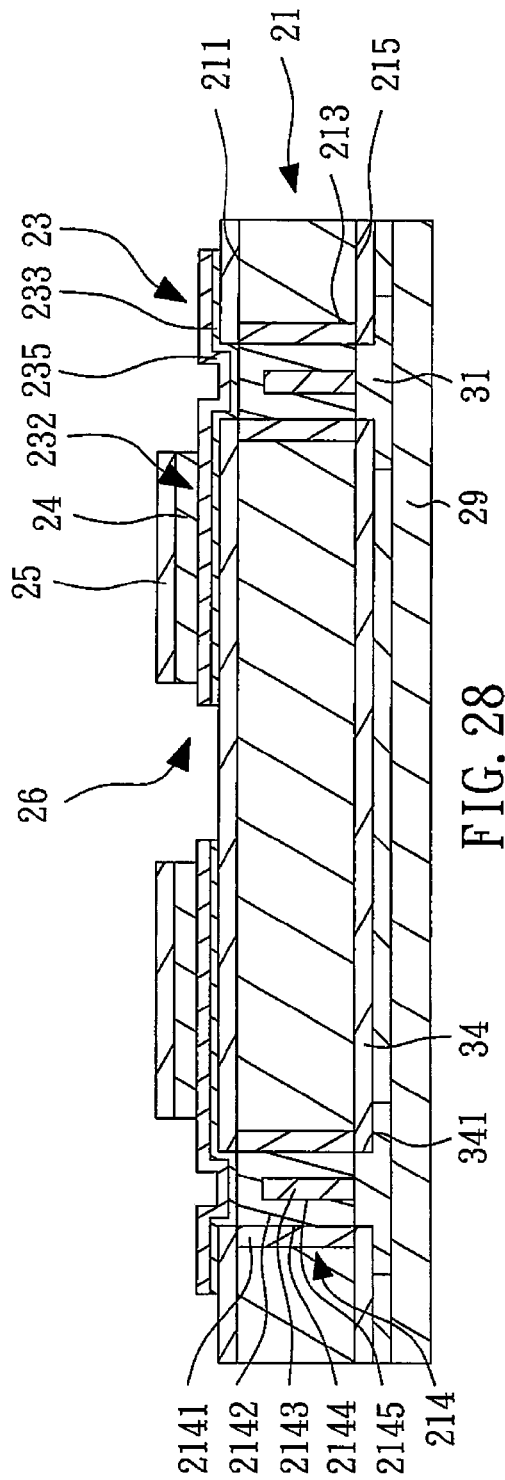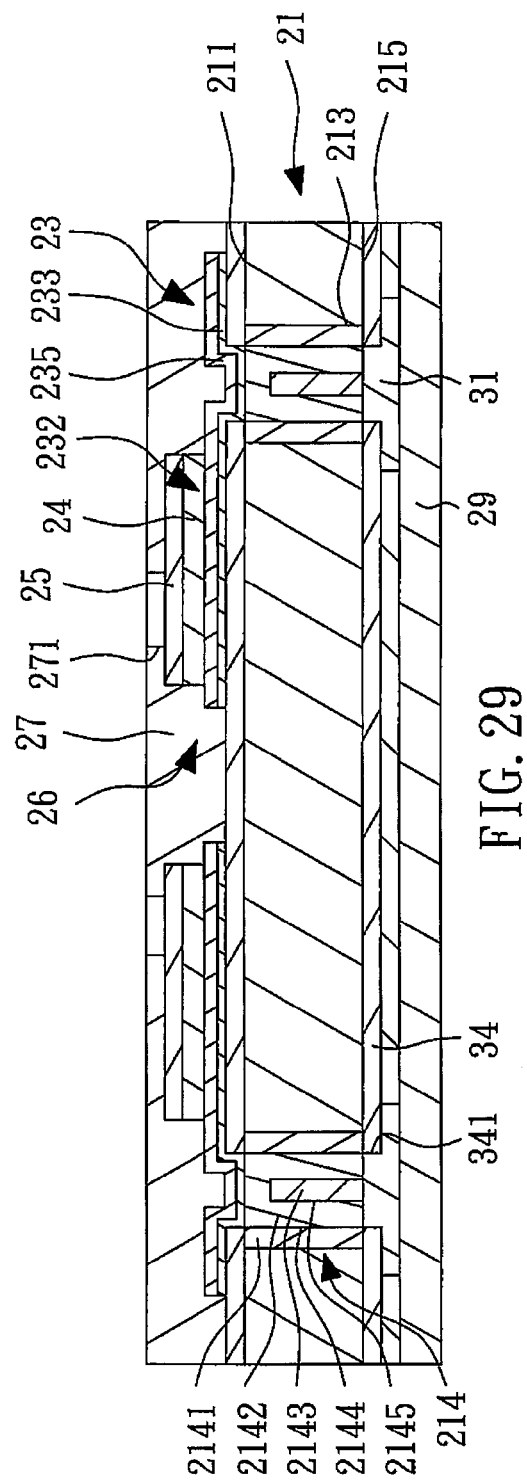

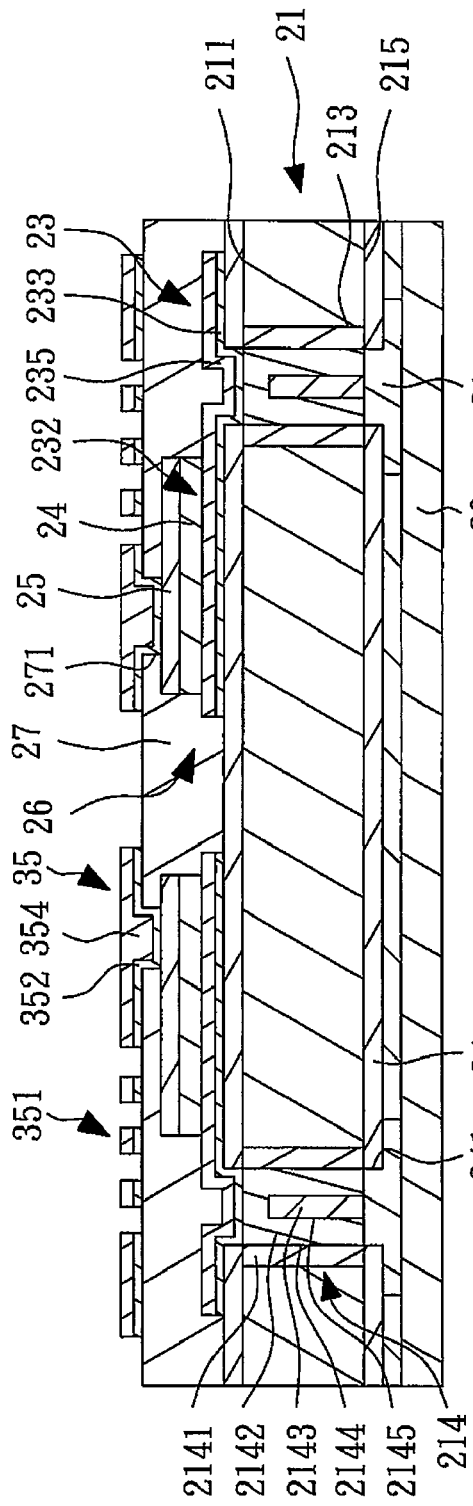
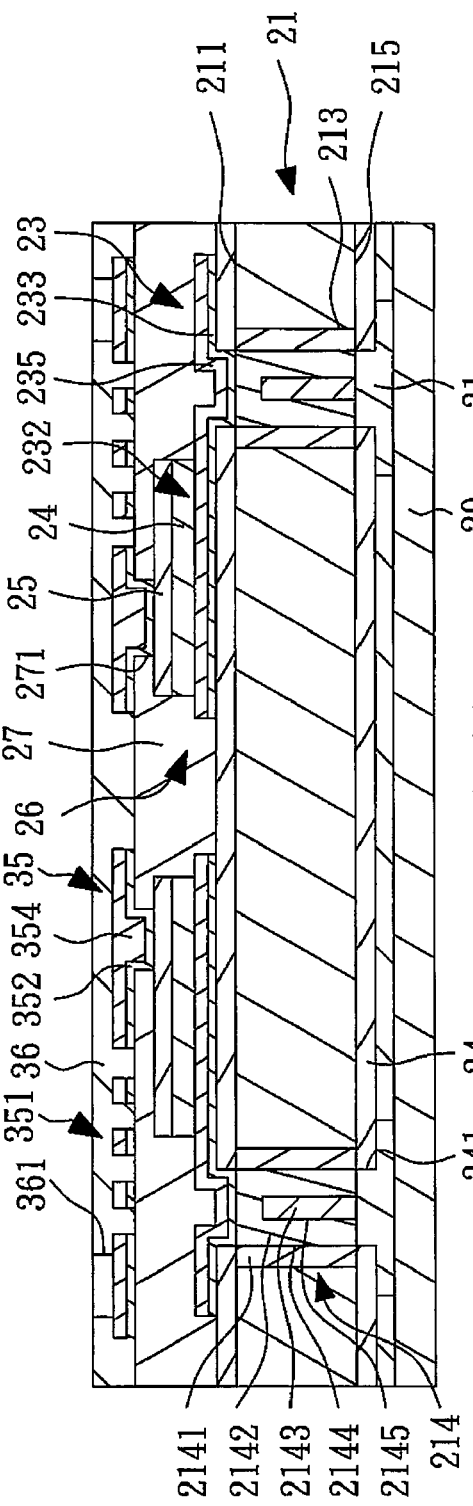
FIG. 30
FIG. 31

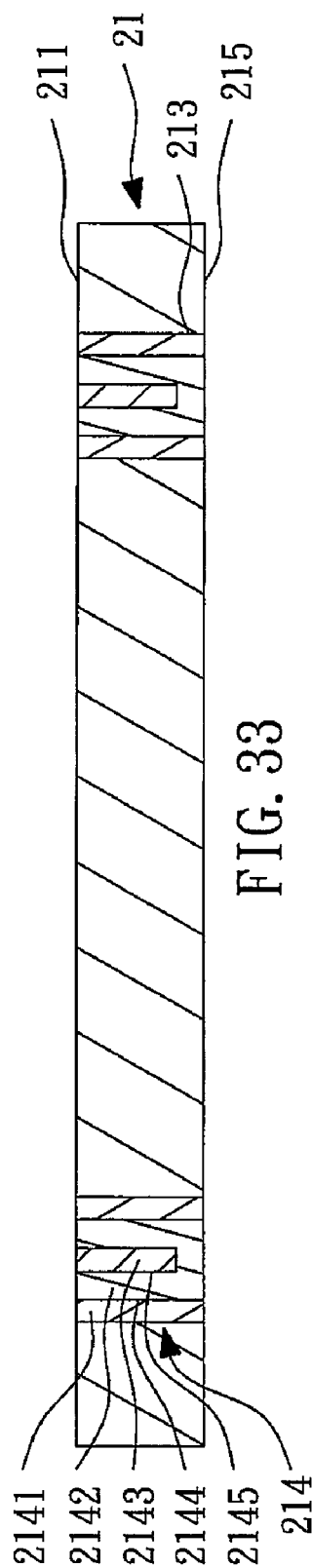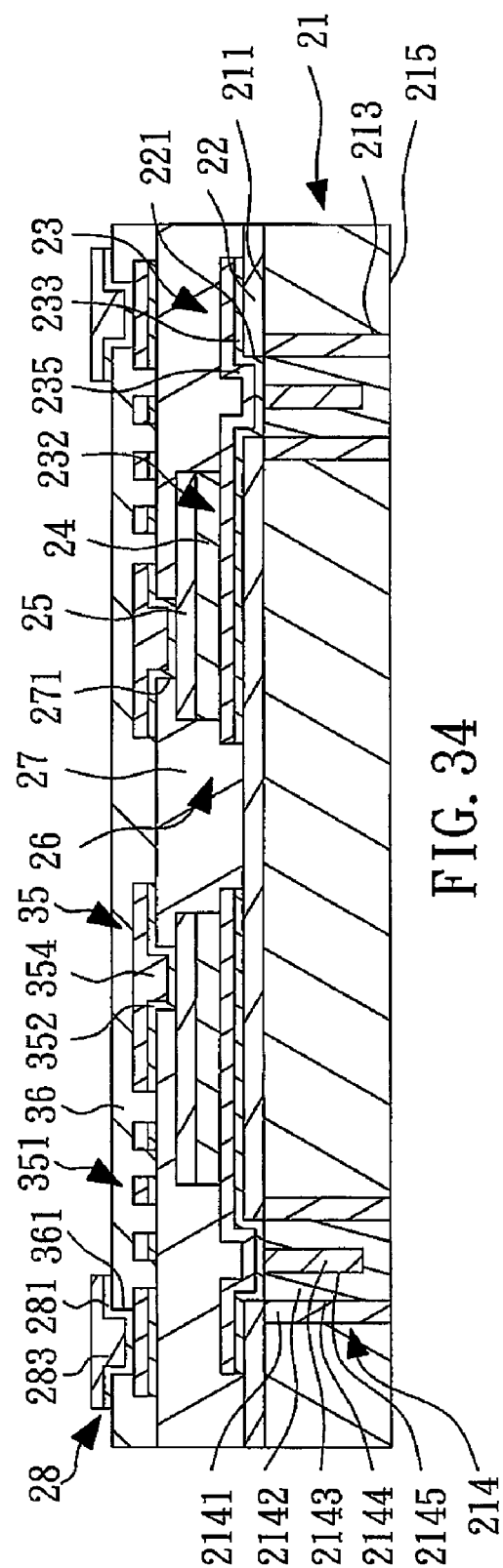

SEMICONDUCTOR PACKAGE AND METHOD FOR MAKING THE SAME

BACKGROUND OF THE INVENTION

1. Field of the Invention

The present invention relates to a semiconductor package and method for making the same, and more particularly to a semiconductor package having passive device and method for making the same.

2. Description of the Related Art

FIG. 1 shows a cross-sectional view of a conventional semiconductor package. The conventional semiconductor package 1 comprises a substrate 11, a package unit 12 and a molding compound 13. The package unit 12 comprises a plurality of passive devices (not shown in the FIGs). The package unit 12 is disposed on the substrate 11, and electrically connects the substrate 11. The molding compound 13 encapsulates the package unit 12.

The conventional semiconductor package 1 has the following defects. The passive devices are integrated into the package unit 12 by a semiconductor packaging process. Then, the package unit 12 electrically connects the substrate 11 by wire-bonding method or flip-chip method (not shown in the FIGs). Therefore, the process for integrating the passive devices in the semiconductor package 1 are complex and increase cost.

Therefore, it is necessary to provide a semiconductor package and method for making the same to solve the above problems.

SUMMARY OF THE INVENTION

The present invention is directed to a method for making a semiconductor package. The method comprises the steps of: (a) providing a substrate, the substrate having at least one groove and at least one conductive via structure, the conductive via structure disposed in the groove; (b) forming a first metal layer on the substrate, the first metal layer having a first lower electrode, the first metal layer directly contacting the conductive via structure; (c) forming a first dielectric layer and a first upper electrode on the first lower electrode, wherein the first dielectric layer is disposed between the first upper electrode and the first lower electrode, and the first upper electrode, the first dielectric layer and the first lower to electrode form a first capacitor; (d) forming a first protective layer, encapsulating the first capacitor, the first protective layer having at least one first opening, part of the first upper electrode exposed on the first opening; (e) forming a second metal layer on the first protective layer, the second metal layer having a first inductor, the second metal layer directly contacting the first upper electrode; and (f) forming a second protective layer, encapsulating the first inductor.

Therefore, the method of the invention can simplify the process of the first inductor and the first capacitor, and the first inductor, the first capacitor and the via structure can be integrated into the semiconductor package so as to reduce the size of the product.

The present invention is further directed to a semiconductor package. The semiconductor package comprises a substrate, a first metal layer, a first dielectric layer, a first upper electrode, a first protective layer, a second metal layer and a second protective layer. The substrate has a first surface, a second surface, at least one groove and at least one via structure. The groove penetrates through the first surface and the second surface. The via structure is disposed in the groove and is exposed on the first surface and the second surface of the substrate. The first metal layer is disposed on the first surface of the substrate, and has a first lower electrode. The first metal layer directly contacts the via structure. The first dielectric layer is disposed on the first lower electrode. The first upper electrode is disposed on the first dielectric layer. The first upper electrode, the first dielectric layer and the first lower electrode form a first capacitor. The first protective layer encapsulates the first capacitor. The first protective layer has at least one first opening. Part of the first upper electrode is exposed on the first opening. The second metal layer is disposed on the first protective layer, and has a first inductor. The second metal layer directly contacts the first upper electrode. The second protective layer encapsulates the first inductor.

Therefore, the first inductor, the first capacitor and the via structure can be integrated into the semiconductor package so as to reduce the size of the product.

BRIEF DESCRIPTION OF THE DRAWINGS

FIGS. 2 to 22 are schematic views for illustrating a method for making a semiconductor package according to a first embodiment of the present invention;

FIGS. 24 to 32 are schematic views for illustrating a method for making a semiconductor package according to the third embodiment of the present invention; and FIGS. 33 to 35 are schematic views for illustrating a method for making a semiconductor package according to a fourth embodiment of the present invention.

DETAILED DESCRIPTION OF THE INVENTION

Figure 1:
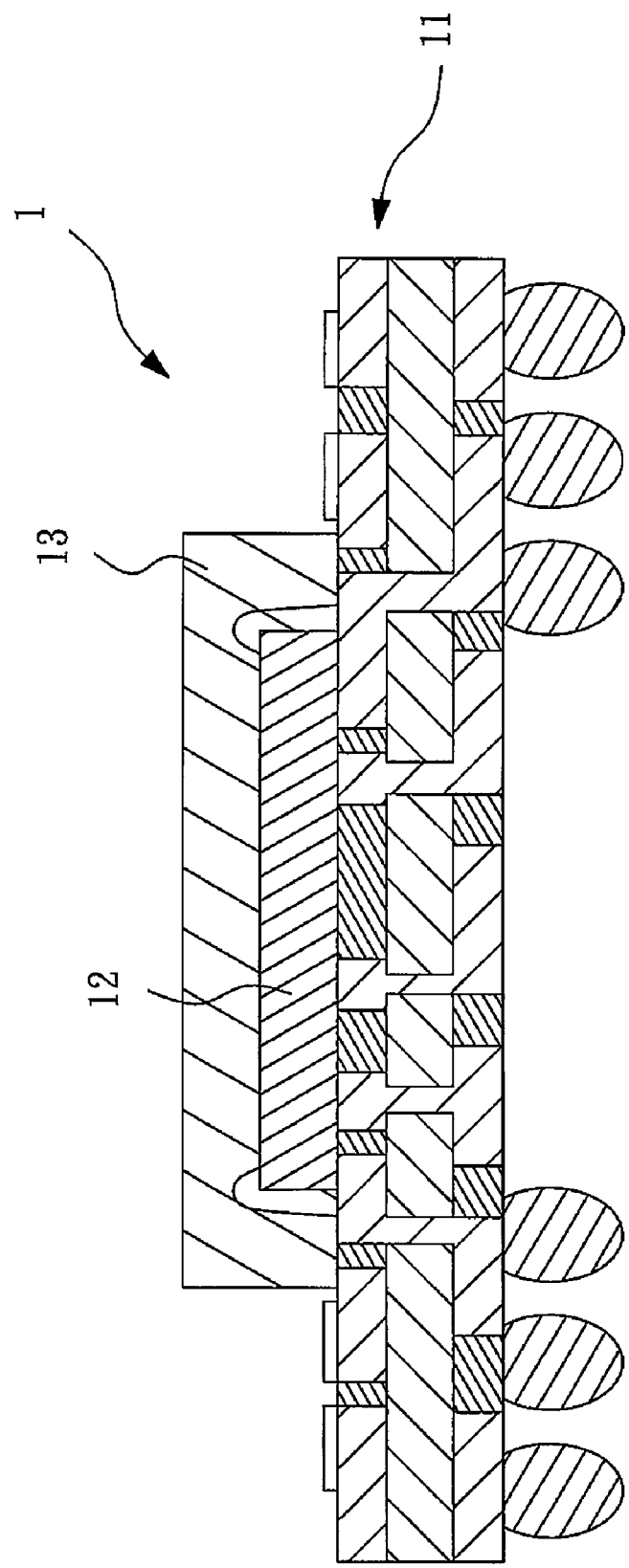
FIG. 1 is a cross-sectional view of a conventional semiconductor package.
Figure 2:
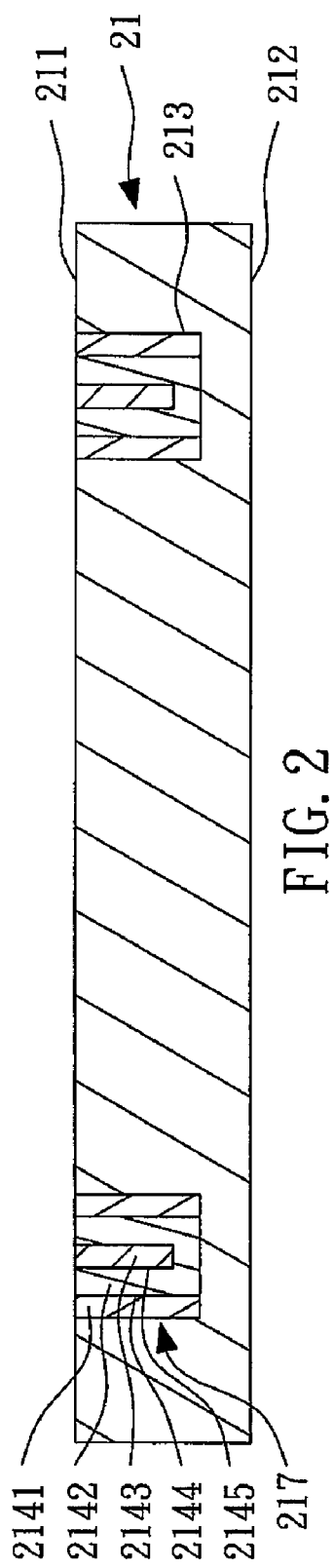

FIGS. 2 to 22 show schematic views for illustrating a method for making a semiconductor package according to a first embodiment of the present invention. Referring to FIG. 2, a substrate 21 is shown. The substrate 21 has a first surface 211, a lower surface 212, at least one groove 213 and at least one conductive via structure 217. The groove 213 has an opening disposed on the first surface 211 of the substrate 21. The conductive via structure 217 is disposed in the groove 213, and is exposed on the first surface 211 of the substrate 21.

In this embodiment, the substrate 21 is non-insulated material, for example silicon or germanium. The conductive via structure 217 comprises an outer insulation layer 2141, a conductor 2142 and an inner insulation layer 2143. The outer insulation layer 2141 is disposed on the side wall of the groove 213, and the outer insulation layer 2141 defines a second central groove 2144. The conductor 2142 is disposed on the side wall of the second central groove 2144, and the conductor 2142 defines a first central groove 2145. The inner insulation layer 2143 is filled up the first central groove 2145. In other embodiments, the outer insulation layer 2141 can also be disposed on the bottom wall of the groove 213 (not shown). Since the substrate 21 is non-insulated material, the outer insulation layer 2141 is used for insulating the substrate 21 and the conductor 2142 so as to prevent the current which passes through the conductive via structure 217 being conducted to the substrate 21 and reducing the electrical character of the conductive via structure 217.

Figure 3:
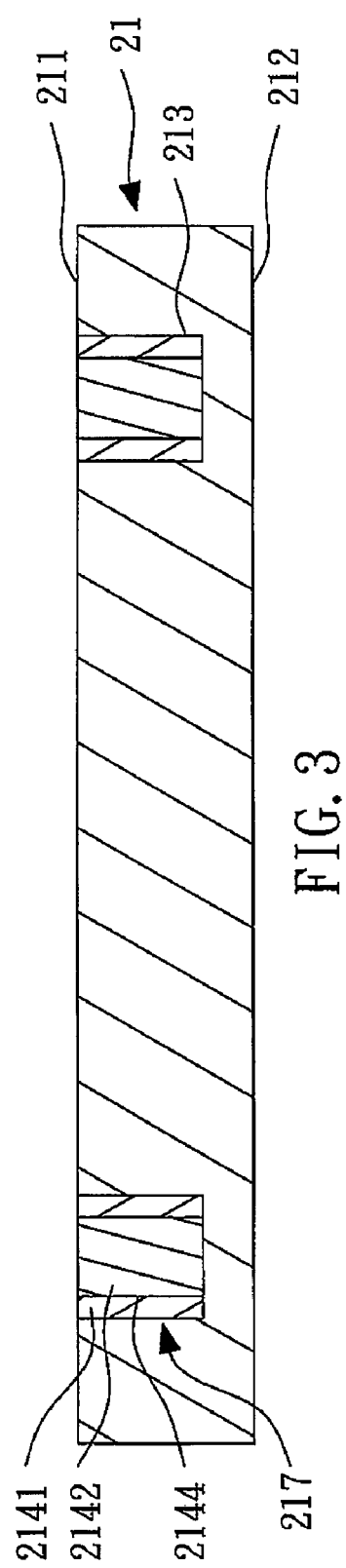

However, in other embodiments, as shown in FIG. 3, the conductive via structure 217 may only comprise an outer insulation layer 2141 and a conductor 2142, and does not comprise the inner insulation layer 2143 (FIG. 2). The outer insulation layer 2141 is disposed on the side wall of the groove 213, and the outer insulation layer 2141 defines a second central groove 2144. The conductor 2142 is filled up the second central groove 2144. Besides, the substrate 21 can be made of insulation material, for example glass or silicon oxide, and the conductive via structure 217 may not comprise the outer insulation layer 2141 (FIG. 2). Therefore, as shown in FIG. 4, the conductive via structure 217 may only comprise a conductor 2142 and an inner insulation layer 2143, wherein the conductor 2142 is disposed on the side wall and the bottom of the groove 213 to define a first central groove 2145, and the first central groove 2145 is filled with the inner insulation layer 2143. In addition, as shown in FIG. 5, the conductive via structure 217 may only comprise a conductor 2142, wherein the groove 213 is filled with the conductor 2142. As shown in FIG. 6, a first insulation bottom layer 22 is formed on the substrate 21. In this embodiment, the first insulation bottom layer 22 is disposed on the first surface 211 of the substrate 21, and has a first through via 221. The conductive via structure 217 is exposed in the first through via 221.

Then, a first metal layer 23 (FIG. 9) is formed on the substrate 21, the first metal layer 23 has a first lower electrode 232. In this embodiment, the first metal layer 23 is disposed on the first insulation bottom layer 22, and the first metal layer 23 directly contacts the conductive via structure 217. The steps of forming the first metal layer 23 are described as follows. Referring to FIG. 7, a first seed layer 233 is formed on the substrate 21. Referring to FIG. 8, a first photo resist 234 is formed on the first seed layer 233 to cover part of the first seed layer 233 and to expose part of the first seed layer 233. And, a first plating layer 235 is formed on the exposed part of the first seed layer 233. Referring to FIG. 9, the first photo resist 234 (FIG. 8) and the covered part of the first seed layer 233 are removed, and the first plating layer 235 and part of the first seed layer 233 form the first metal layer 23.

Then, a first dielectric layer 24 (FIG. 11) and a first upper electrode 25 (FIG. 11) are formed on the first lower electrode 232. The first dielectric layer 24 is disposed between the first upper electrode 25 and the first lower electrode 232, and the first upper electrode 25, the first dielectric layer 24 and the first lower electrode 232 form a first capacitor 26 (FIG. 11). The steps of forming the first dielectric layer 24 are described as follows. Referring to FIG. 10, a third metal layer is formed on the first lower electrode 232, for example by sputtering method, and proceeding anodic oxidation process to the third metal layer to form a first oxide layer 241. The material of the third metal layer is Tantalum (Ta), and the material of the first oxide layer 241 is Tantalum Pentoxide ($Ta_2O_5$). Then, a fourth metal layer 251 is formed on the first oxide layer 241, for example by sputtering method. The material of the fourth metal layer 251 is AlCu. Then, a second photo resist 261 is forming on the fourth metal layer 251. Referring to FIG. 11, part of the first oxide layer 241 (FIG. 10) and part of the fourth metal layer 251 (FIG. 10) are removed to form the first dielectric layer 24 and the first upper electrode 25 respectively, and form the first capacitor 26. The second photo resist 261 (FIG. 10) is removed.

Figure 12:
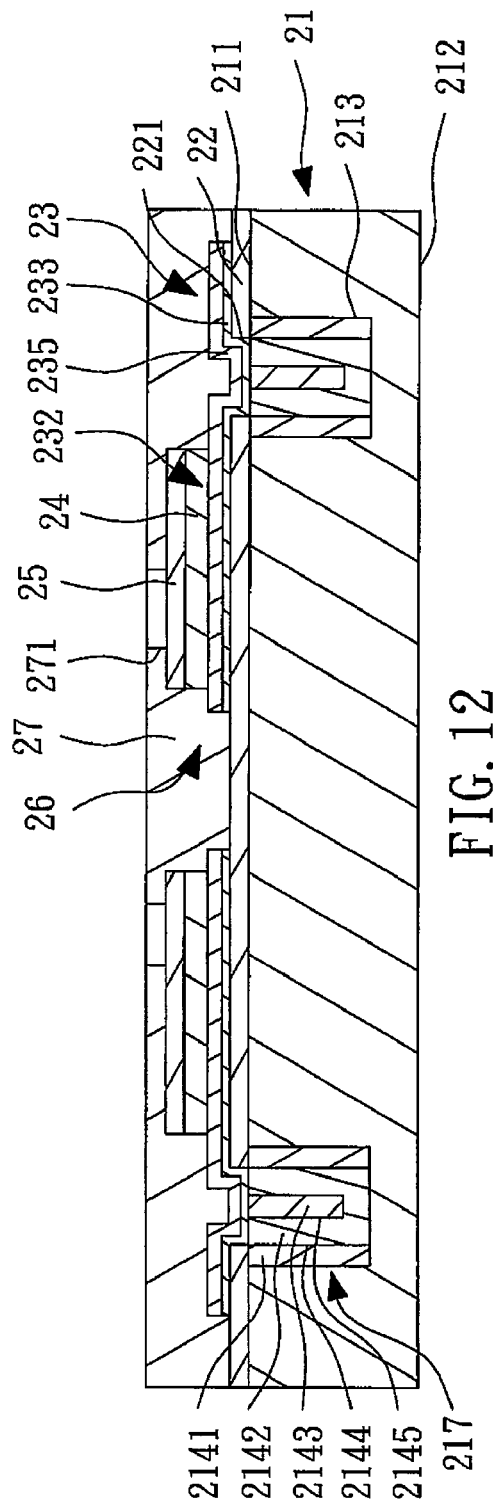

Referring to FIG. 12, a first protective layer 27 is formed for encapsulating the first capacitor 26. The first protective layer 27 has at least one first opening 271, and part of the first upper electrode 25 is exposed on the first opening 271.

Figure 13:
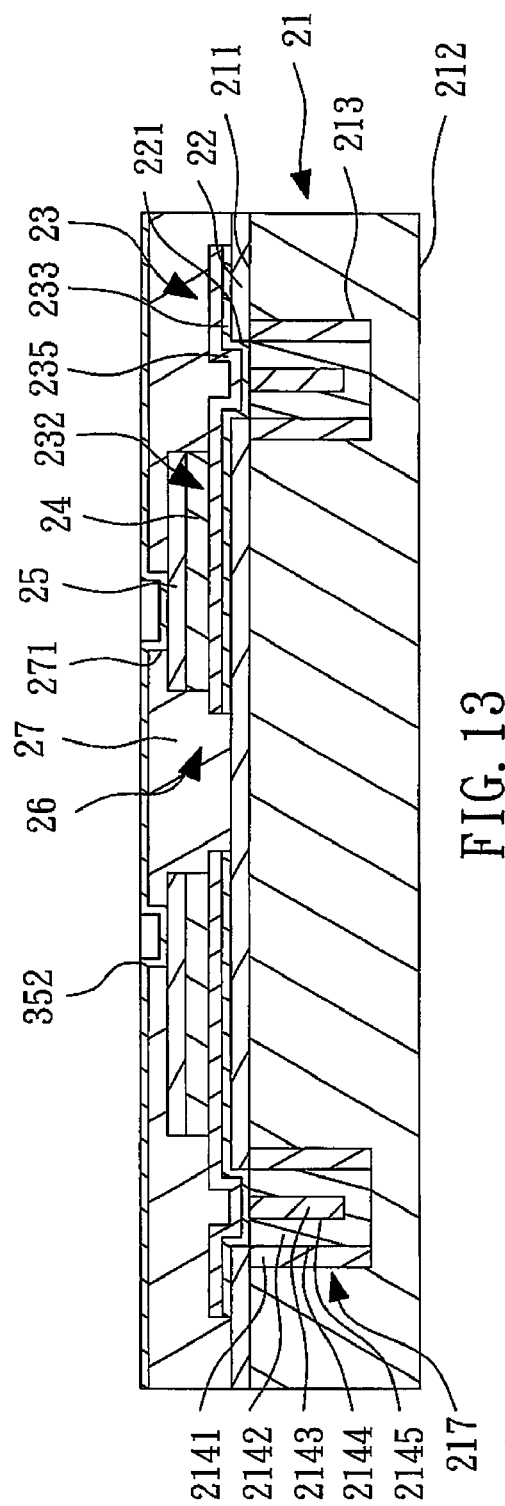
Figure 14:
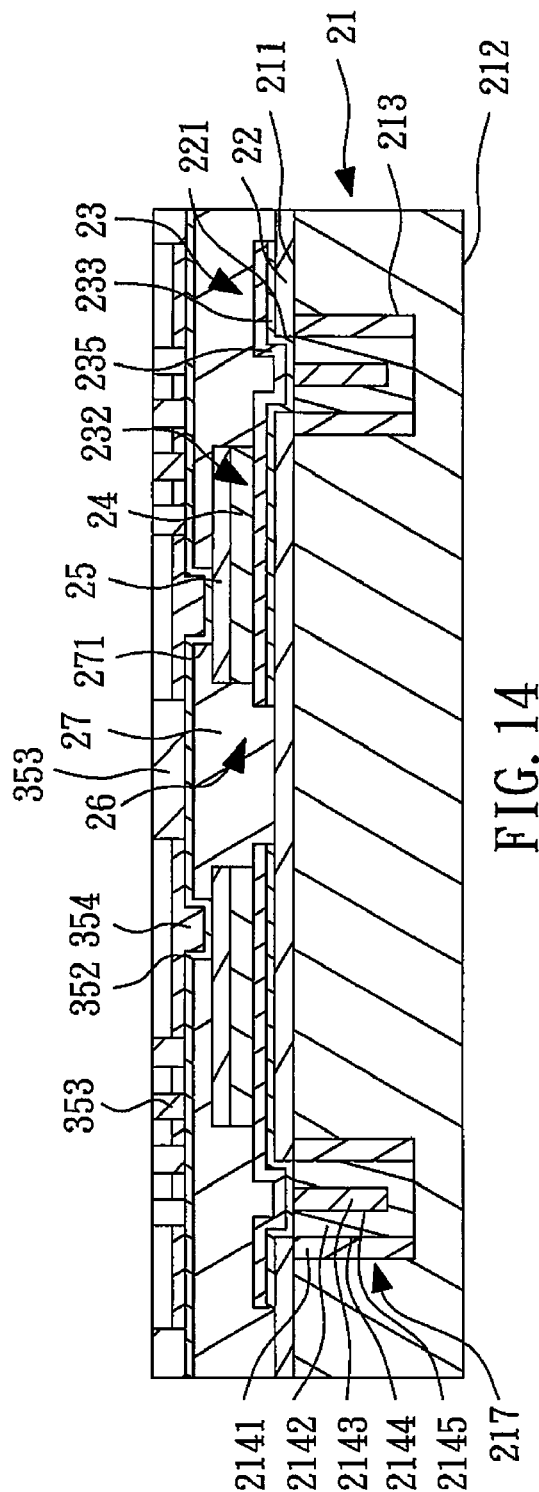
Figure 15:
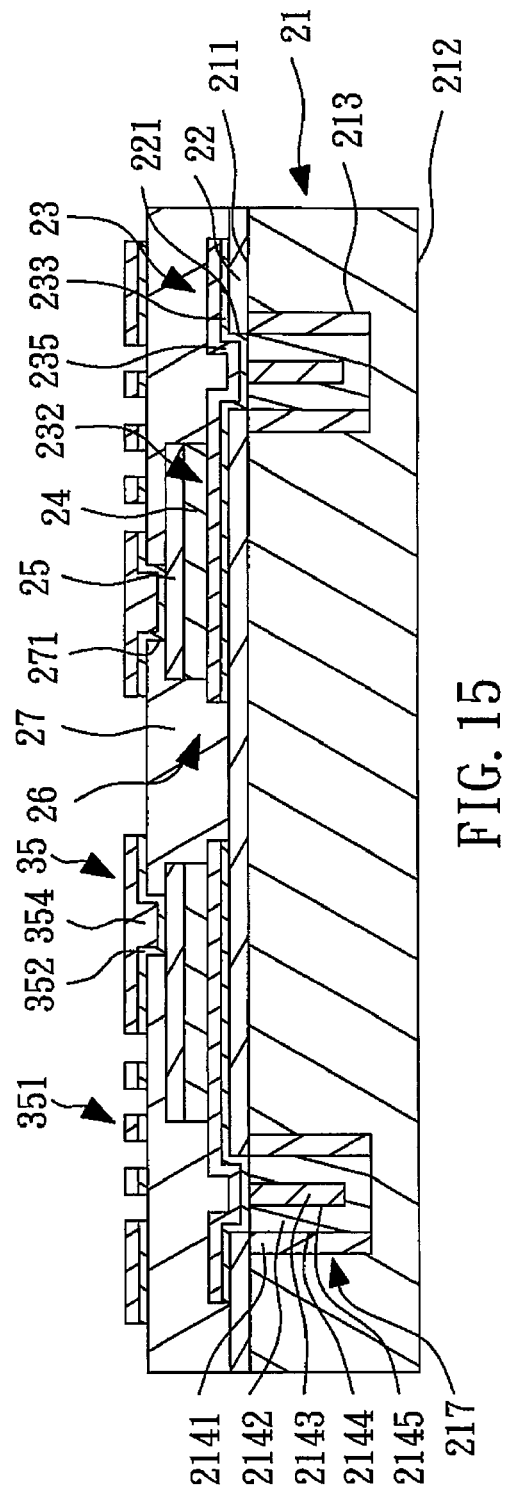

Then, a second metal layer 35 (FIG. 15) is formed on the first protective layer 27. The second metal layer 35 has a first inductor 351, and the second metal layer 35 directly contacts the first upper electrode 25. In this embodiment, the steps of forming the second metal layer 35 are described as follows. Referring to FIG. 13, a second seed layer 352 is formed on the first protective layer 27. Referring to FIG. 14, a third photo resist 353 is formed on the second seed layer 352 to cover part of the second seed layer 352 and to expose part of the second seed layer 352. And, a second plating layer 354 is formed on the exposed part of the second seed layer 352. Referring to FIG. 15, the third photo resist 353 (FIG. 14) and the covered part of the second seed layer 352 are removed, and the second plating layer 354 and part of the second seed layer 352 form the second metal layer 35. Referring to FIG. 16, a second protective layer 36 is formed for encapsulating the first inductor 351. The second protective layer 36 comprises at least one second opening 361, and part of the second metal layer 35 is exposed on the second opening 361.

Figure 18:
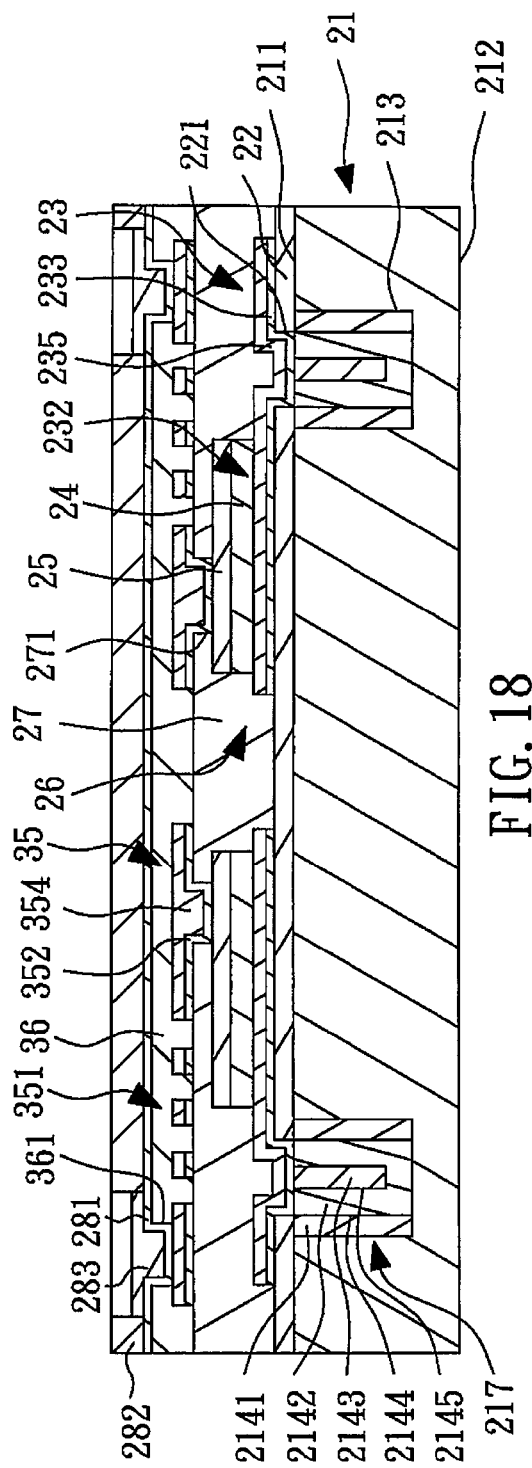
Figure 19:
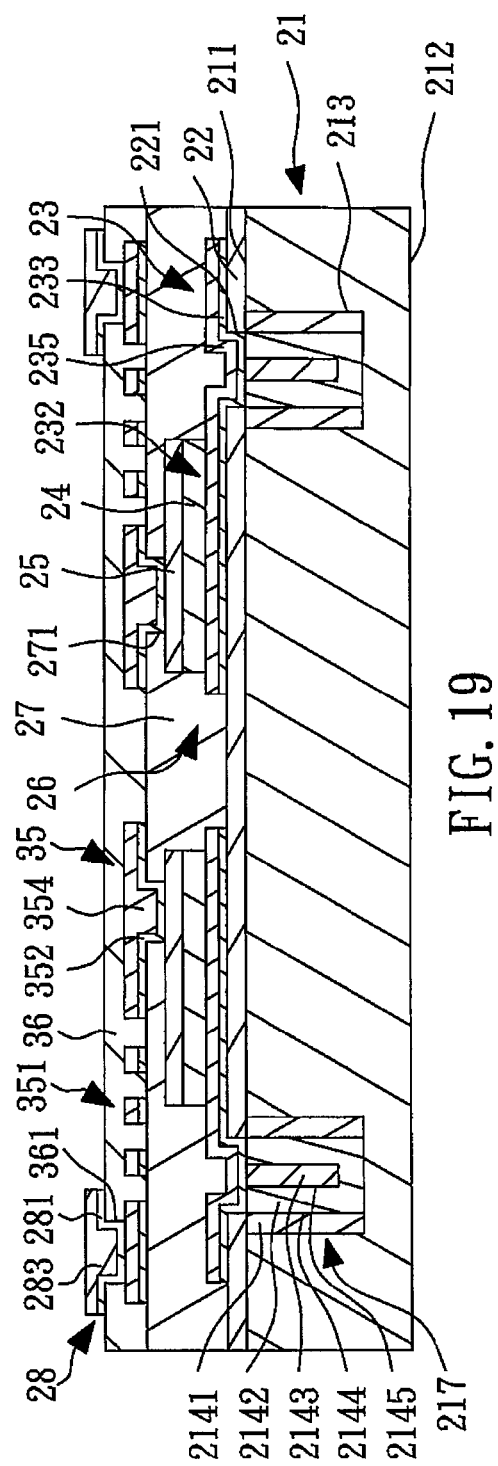

Then, at least one first bump 28 (FIG. 19) is formed in the second opening 361 of the second protective layer 36, and the first bump 28 is electrically connected to the second metal layer 35. In this embodiment, the steps of forming the first bump 28 are described as follows. Referring to FIG. 17, a third seed layer 281 is formed on the second protective layer 36. Referring to FIG. 18, a fourth photo resist 282 is formed on the third seed layer 281 to cover part of the third seed layer 281 and to expose part of the third seed layer 281. And, a third plating layer 283 is formed on the exposed part of the third seed layer 281. Referring to FIG. 19, the fourth photo resist 282 and the covered part of the third seed layer 281 are removed to form the first bump 28.

Figure 20:
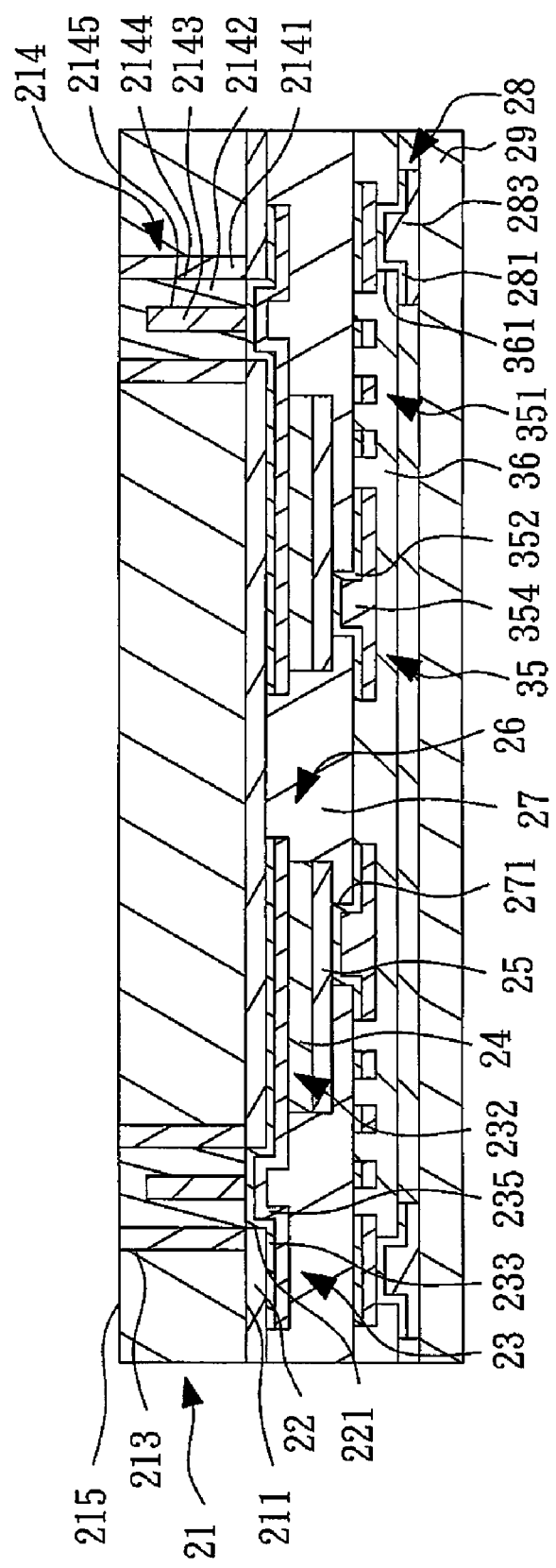

Referring to FIG. 20, the substrate 21 is mounting on a carrier 29, wherein the first surface 211 of the substrate 21 faces the carrier 29. And, part of the substrate 21 is removed from the lower surface 212 (FIG. 19) of the substrate 21 to form a second surface 215, and the conductor 2142 of the conductive via structure 217 (FIG. 19) is exposed on the second surface 215 of the substrate 21 to form a via structure 214. In other embodiments, the substrate 21 can be removed further to expose the inner insulation layer 2143 of the conductive via structure 217 (FIG. 19) on the second surface 215 of the substrate 21 so as to ensure that the conductor 2142 of the conductive via structure 217 (FIG. 19) is exposed on the second surface 215.

Figure 21:
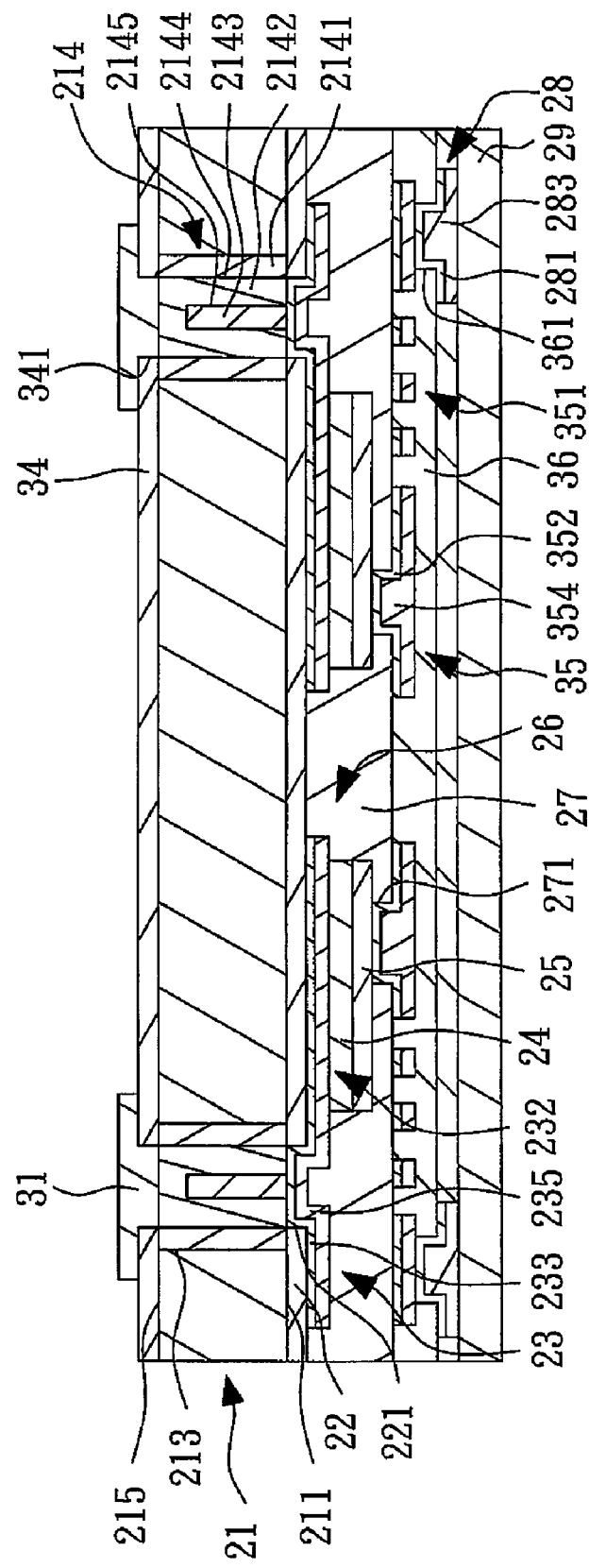
Figure 22:
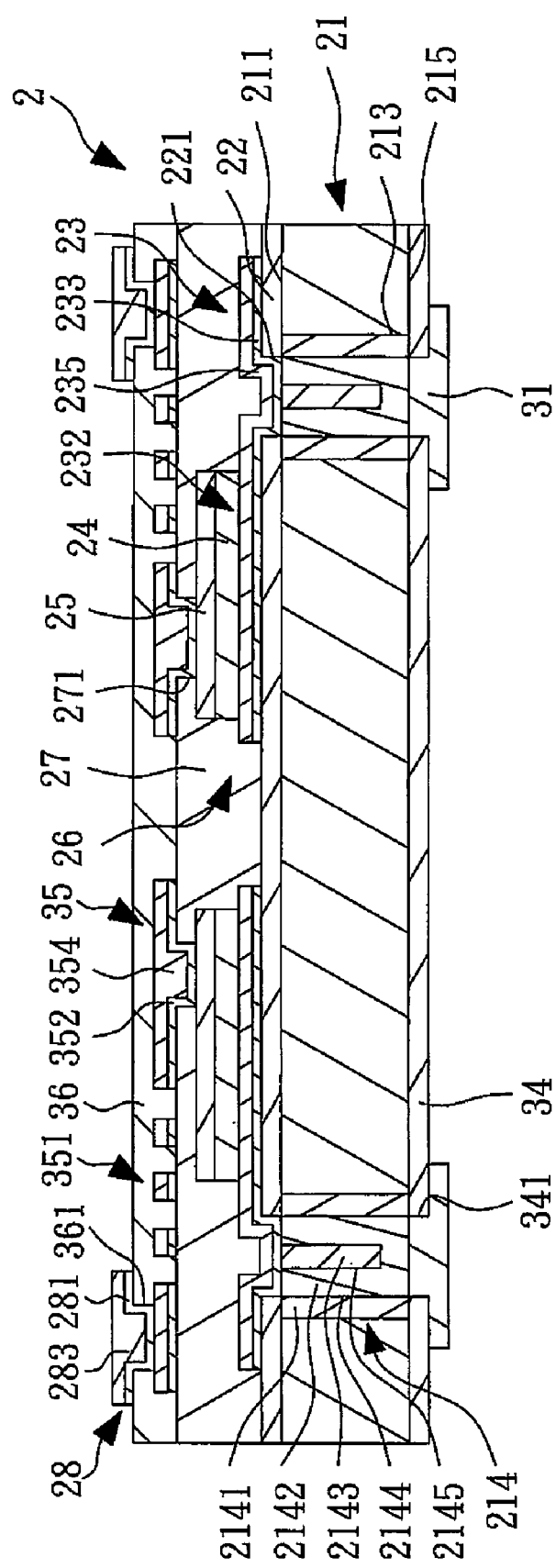
Figure 23:
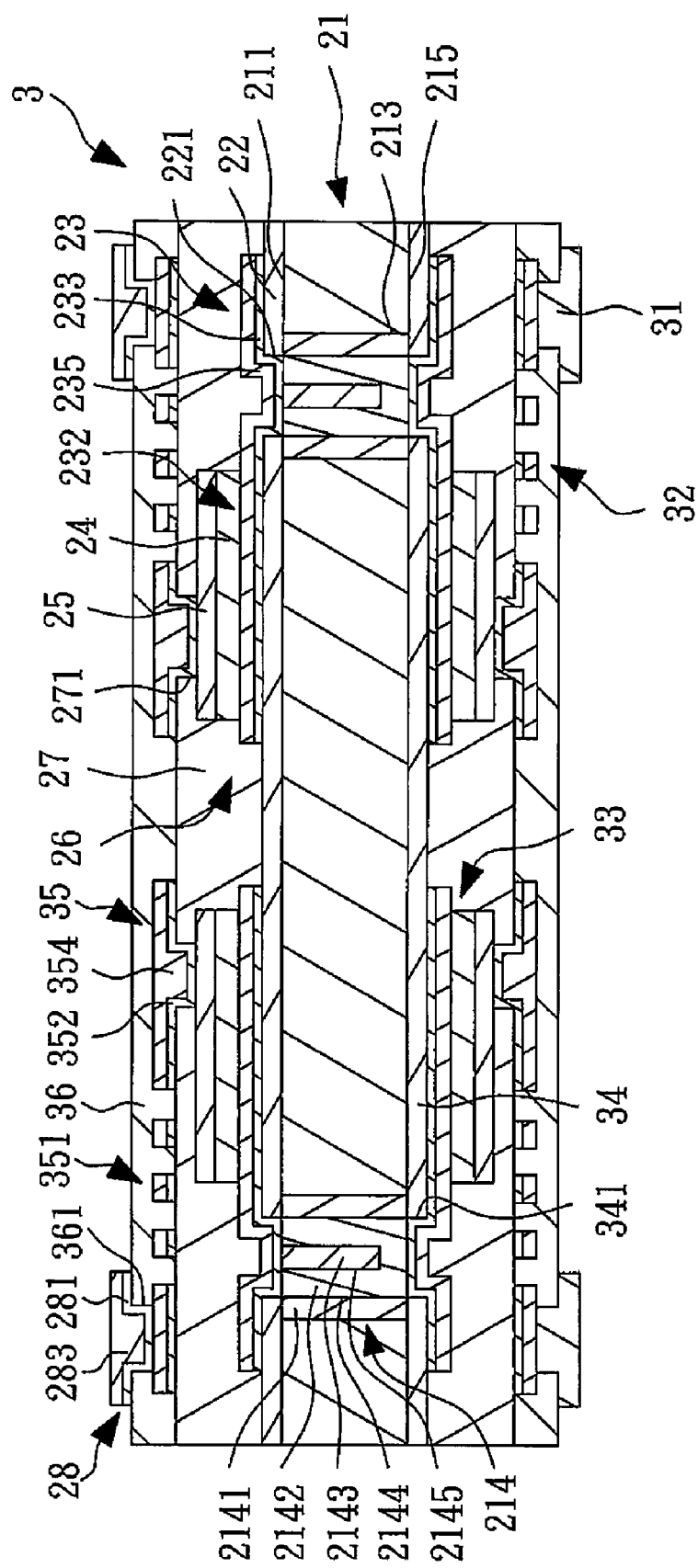
FIG. 23 is a cross-sectional view of a semiconductor package according to a second embodiment of the present invention.

Referring to FIG. 21, at least one electrical device is formed on the second surface 215 of the substrate 21. In this embodiment, the electrical device is a second bump 31. The method for forming the second bump 31 is the same as that for the first bump 28. Referring to FIG. 22, the carrier 29 is removed so as to obtain the semiconductor package 2 according to the first embodiment of the present invention. The electrical device may be a second inductor 32 or a second capacitor 33, as shown in FIG. 23. The method for forming the second inductor 32 and the second capacitor 33 is the same as that for forming the first inductor 351 and the first capacitor 26, that is, the process on the second surface 215 can be the same as that on the first surface 211.

Therefore, the method of this invention can simplify the process of the first inductor 351 and the first capacitor 26, and the first inductor 351, the first capacitor 26 and the via structure 214 can be integrated into the semiconductor package 2 so as to reduce the size of the product.

Referring to FIG. 22 again, it shows a cross-sectional view of the semiconductor package according to the first embodiment of the present invention. The semiconductor package 2 of this embodiment comprises a substrate 21, a first insulation bottom layer 22, a second insulation bottom layer 34, a first metal layer 23, a first dielectric layer 24, a first upper electrode 25, a first protective layer 27, a second metal layer 35, a second protective layer 36, at least one first bump 28 and at least one electrical device. In this embodiment, the electrical device is a second bump 31.

The substrate 21 has a first surface 211, a second surface 215, at least one groove 213 and at least one via structure 214. The groove 213 penetrates through the first surface 211 and the second surface 215. The via structure 214 is disposed in the groove 213, and is exposed on the first surface 211 and the second surface 215 of the substrate 21.

In this embodiment, the substrate 21 is non-insulated material, for example silicon or germanium. The via structure 214 comprises an outer insulation layer 2141, a conductor 2142 and an inner insulation layer 2143. The outer insulation layer 2141 is disposed on the side wall of the groove 213, and the outer insulation layer 2141 defines a second central groove 2144. The conductor 2142 is disposed on the side wall of the second central groove 2144, and the conductor 2142 defines a first central groove 2145. The inner insulation layer 2143 is filled up the first central groove 2145. In other embodiments, the outer insulation layer 2141 can also be disposed on the bottom wall of the groove 213 (not shown). Since the substrate 21 is non-insulated material, the outer insulation layer 2141 is used for insulating the substrate 21 and the conductor 2142 so as to prevent the current which passes through the via structure 214 being conducted to the substrate 21 and reducing the electrical character of the via structure 214.

In other embodiments, the via structure 214 may only comprise an outer insulation layer 2141 and a conductor 2142, and does not comprise the inner insulation layer 2143. The outer insulation layer 2141 is disposed on the side wall of the groove 213, and the outer insulation layer 2141 defines a second central groove 2144. The conductor 2142 is filled up the second central groove 2144. Besides, the material of the substrate may be made of insulation material, for example glass or silicon oxide, and the conductive via structure 217 may not comprise the outer insulation layer 2141. Therefore, the via structure 214 may only comprise a conductor 2142 and an inner insulation layer 2143. The conductor 2142 is disposed on the side wall of the groove 213, and the conductor 2142 defines a first central groove 2145. The inner insulation layer 2143 is filled up the first central groove 2145. In addition, the via structure 214 may only comprise a conductor 2142, and the conductor 2142 is filled up the groove 213.

Referring to FIG. 22 again, the first insulation bottom layer 22 is disposed on the first surface 211 of the substrate 21, and has a first through via 221. The via structure 214 is exposed in the first through via 221. The second insulation bottom layer 34 is disposed on the second surface 215 of the substrate 21, and has a second through via 341. The via structure 214 is exposed in the second through via 341. The first metal layer 23 is disposed on the first surface 211 of the substrate 21, preferably, is disposed on the first insulation bottom layer 22, and has a first lower electrode 232. The first metal layer 23 directly contacts the via structure 214. The first dielectric layer 24 is disposed on the first lower electrode 232. In this embodiment, the material of the first dielectric layer 24 is Tantalum Pentoxide (Ta$_2$O$_5$). The first upper electrode 25 is disposed on the first dielectric layer 24. The first upper electrode 25, the first dielectric layer 24 and the first lower electrode 232 form a first capacitor 26. The material of the first upper electrode 25 is AlCu.

The first protective layer 27 encapsulates the first capacitor 26. In is this embodiment, the first protective layer 27 has at least one first opening 271. Part of the first upper electrode 25 is exposed on the first opening 271. The second metal layer 35 is disposed on the first protective layer 27, and has a first inductor 351. The second metal layer 35 directly contacts the first upper electrode 25. The second protective layer 36 encapsulates the first inductor 351. In this embodiment, the second protective layer 36 comprises at least one second opening 361, and part of the second metal layer 35 is exposed on the second opening 361. The first bump 28 is disposed in the second opening 361 of the second protective layer 36, and the first bump 28 is electrically connected to the second metal layer 35. The electrical device is disposed on the second surface 215 of the substrate 21. The electrical device is a second bump 31.

Therefore, the first inductor 351, the first capacitor 26 and the via structure 214 can be integrated into the semiconductor package so as to reduce the size of the product.

FIG. 23 shows a cross-sectional view of a semiconductor package according to a second embodiment of the present invention. The semiconductor package 3 according to the second embodiment is substantially the same as the semiconductor package 2 (FIG. 22) according to the first embodiment, and the same elements are designated by the same reference numbers. The difference between the semiconductor package 3 according to the second embodiment and the semiconductor package 2 according to the first embodiment is that the semiconductor package 3 further comprises a plurality of electrical devices on the second surface 215, for example a second inductor 32, a second capacitor 33 and a second bump 31.

Figure 24:
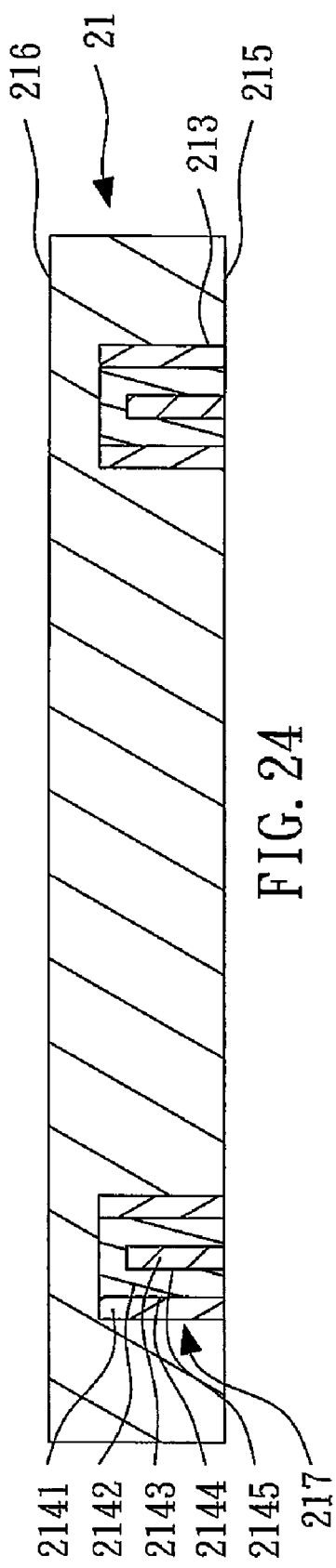
Figure 25:
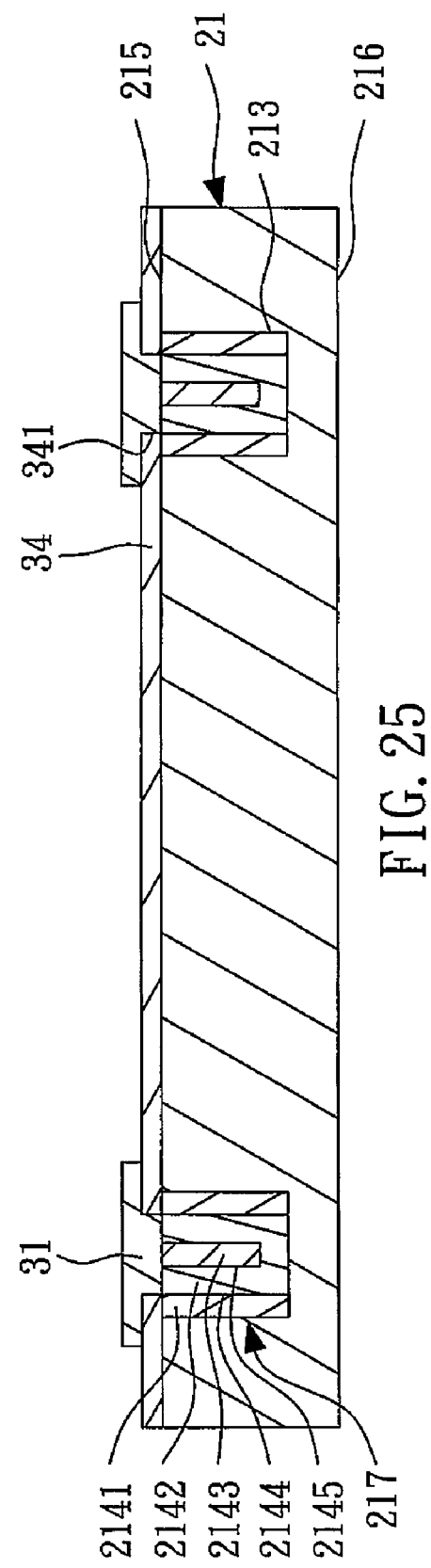
Figure 26:
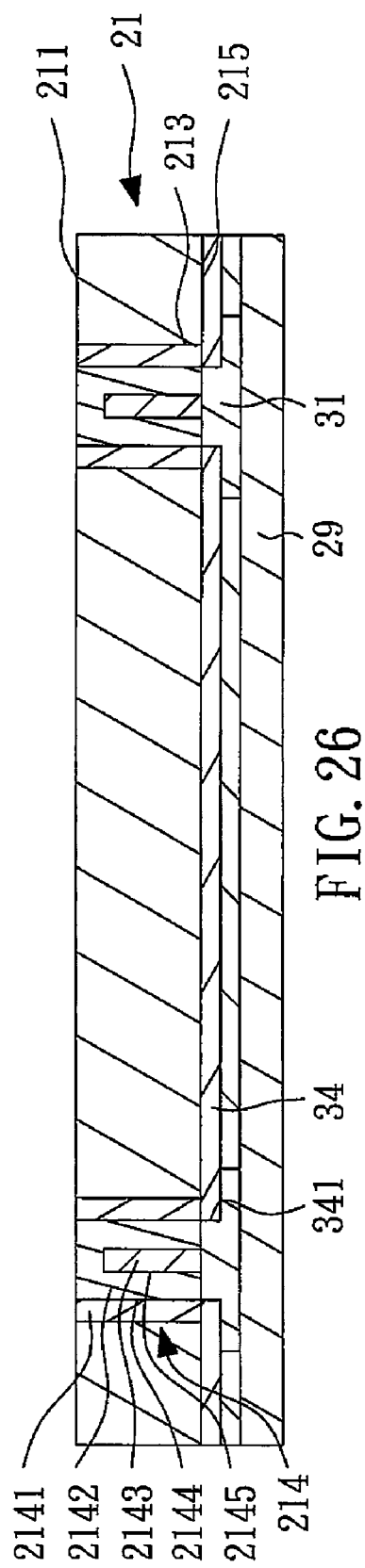

FIGS. 24 to 32 are schematic views for illustrating a method for making a semiconductor package according to the third embodiment of the present invention. Referring to FIG. 24, the substrate 21 is shown. In this embodiment, the substrate 21 has an upper surface 216 and a second surface 215, at least one groove 213 and at least one conductive via structure 217. The groove 213 has an opening disposed on the second surface 215 of the substrate 21, and the conductive via structure 217 is disposed in the groove 213, and is exposed on the second surface 215 of the substrate 21. Referring to FIG. 25, a second insulation bottom layer 34 is formed on the substrate 21. In this embodiment, the second insulation bottom layer 34 is disposed on the second surface 215 of the substrate 21, and has a second through via 341. The conductive via structure 217 is exposed in the second through via 341. Then, at least one electrical device is formed on the second surface 215 of the substrate 21, preferably, on the second insulation bottom layer 34. In this embodiment, the electrical device is a second bump 31. Referring to FIG. 26, the substrate 21 is mounting on a carrier 29, and the second surface 215 of the substrate 21 faces the carrier 29. And, part of the substrate 21 is removed from the upper surface 216 (FIG. 25) of the substrate 21 to form a first surface 211, and the conductive via structure 217 is exposed on the first surface 211 of the substrate 21 to form a via structure 214.

Figure 27:
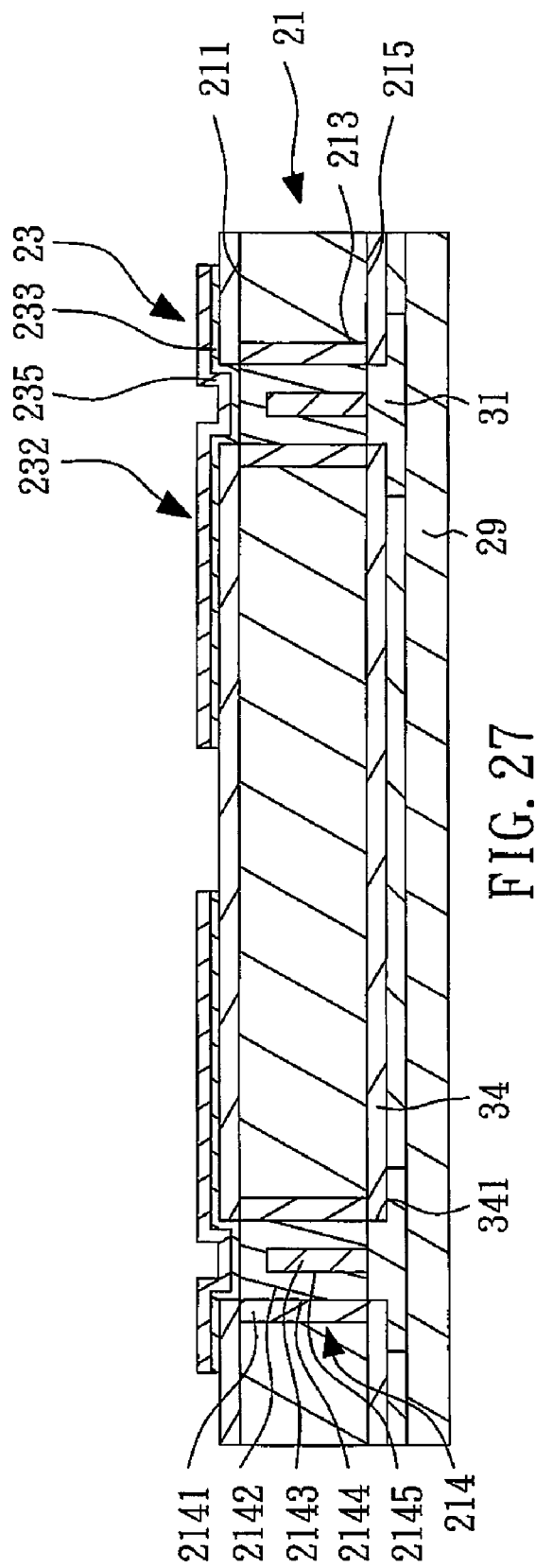
Figure 32:
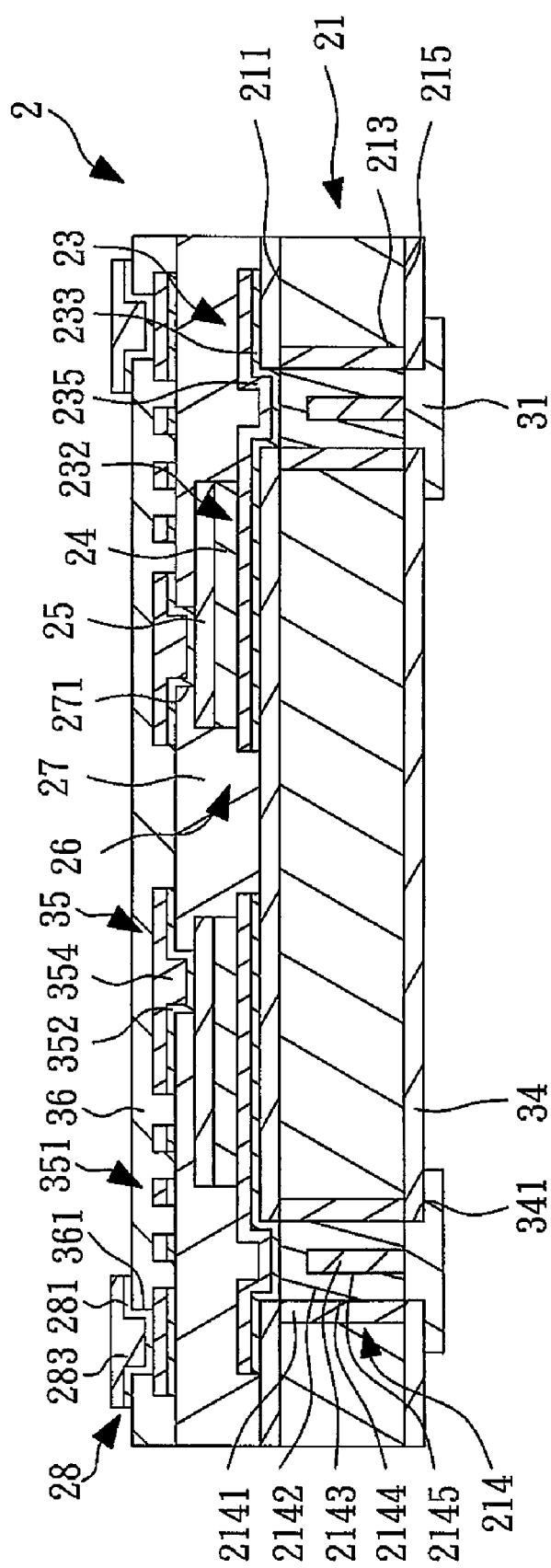

Referring to FIG. 27, a first metal layer 23 is formed on the substrate 21, preferably, on the first surface 211 of the substrate 21. A first plating layer 235 and a first seed layer 233 form the first metal layer 23. The first metal layer 23 has a first lower electrode 232. Referring to FIG. 28, a first dielectric layer 24 and a first upper electrode 25 are formed on the first lower electrode 232. The first dielectric layer 24 is disposed between the first upper electrode 25 and the first lower electrode 232, and the first upper electrode 25, the first dielectric layer 24 and the first lower electrode 232 form a first capacitor 26. Referring to FIG. 29, a first protective layer 27 is formed for encapsulating the first capacitor 26. The first protective layer 27 has at least one first opening 271, and part of the first upper electrode 25 is exposed on the first opening 271. Referring to FIG. 30, a second metal layer 35 is formed on the first protective layer 27. A second plating layer 354 and a second seed layer 352 form the second metal layer 35. The second metal layer 35 has a first inductor 351, and the second metal layer 35 directly contacts the first upper electrode 25. Referring to FIG. 31, a second protective layer 36 is formed for encapsulating the first inductor 351. The second protective layer 36 comprises at least one second opening 361, and part of the second metal layer 35 is exposed on the second opening 361. Referring to FIG. 32, at least one first bump 28 is formed in the second opening 361 of the second protective layer 36, and the first bump 28 is electrically connected to the second metal layer 35. Then, the carrier 29 is removed so as to obtain the semiconductor package 2 according to the third embodiment of the present invention.

Figure 35:
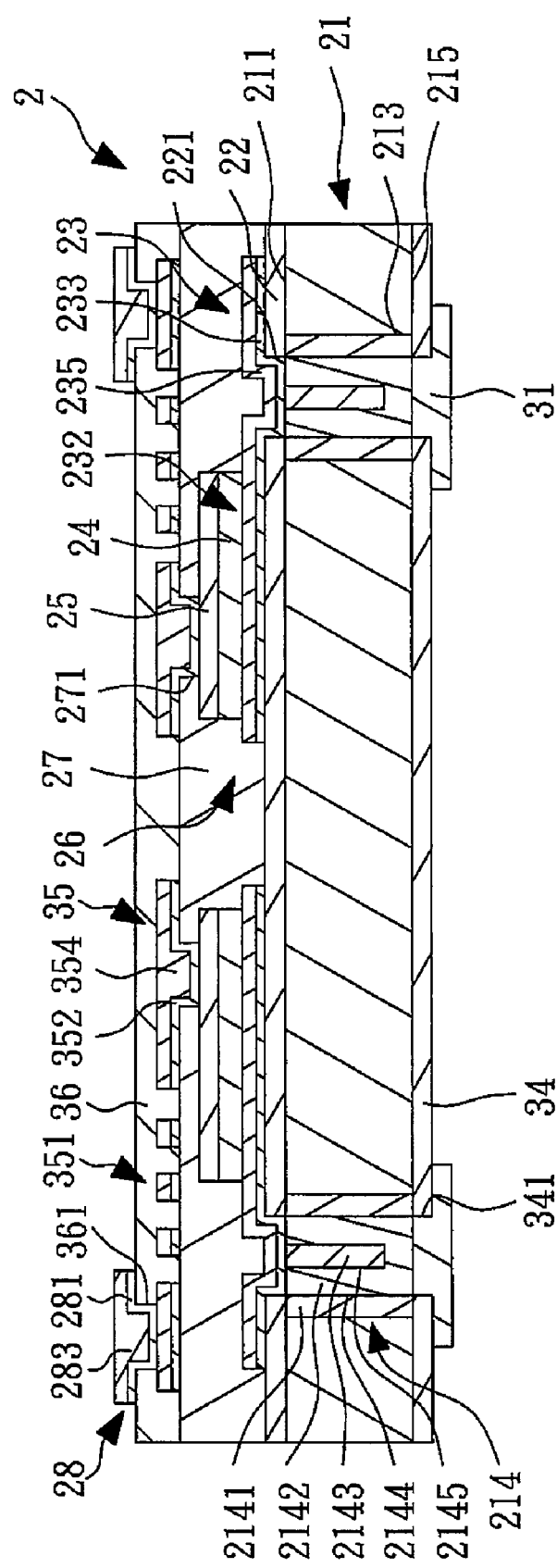

FIGS. 33 to 35 show schematic views for illustrating a method for making a semiconductor package according to a fourth embodiment of the present invention. The method for making a semiconductor package according to the fourth embodiment is substantially the same as the method for making a semiconductor package according to the first embodiment, and the same elements are designated by the same reference numbers. Referring to FIG. 33, the substrate 21 has a first surface 211, a second surface 215, at least one groove 213 and at least one conductive via structure. The groove 213 penetrates through the first surface 211 and the second surface 215. The conductive via structure is disposed in the groove 213, and is exposed on the first surface 211 and the second surface 215 of the substrate 21 to form a via structure 214. Then, referring to FIG. 34, a first inductor 351 and a first capacitor 26 are formed on the first surface 211 of the substrate 21. Referring to FIG. 35, at least one electrical device is formed on the second surface 215 of the substrate 21 so as to obtain the semiconductor package according to the forth embodiment of the present invention. In other embodiments, the electrical device can be formed on the second surface 215 of the substrate 21 first, then the first inductor 351 and the first capacitor 26 are formed on the first surface 211 of the substrate 21.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A semiconductor package, comprising:
    a substrate, having a first surface, a second surface, at least one groove and at least one via structure, the groove penetrating through the first surface and the second surface, the via structure disposed in the groove and exposed on the first surface and the second surface of the substrate;
    a first metal layer, disposed on the first surface of the substrate, and having a first lower electrode, the first metal layer directly contacting the via structure;
    a first dielectric layer, disposed on the first lower electrode;
    a first upper electrode, disposed on the first dielectric layer, wherein the first upper electrode, the first dielectric layer and the first lower electrode form a first capacitor;
    a first protective layer, encapsulating the first capacitor, the first protective layer having at least one first opening, part of the first upper electrode exposed on the first opening;
    a second metal layer, disposed on the first protective layer, and having a first inductor, the second metal layer directly contacting the first upper electrode; and
    a second protective layer, encapsulating the first inductor.

2. The semiconductor package as claimed in claim 1, wherein the material of the substrate is glass or silicon oxide.

3. The semiconductor package as claimed in claim 1, wherein the material of the substrate is silicon or germanium.

4. The semiconductor package as claimed in claim 3, further comprising a first insulation bottom layer and a second insulation bottom layer, the first insulation bottom layer disposed on the first surface of the substrate, the second insulation bottom layer disposed on the second surface of the substrate, and the first metal layer disposed on the first insulation bottom layer.

5. The semiconductor package as claimed in claim 1, wherein the via structure comprises a conductor, the conductor is filled up the groove.

6. The semiconductor package as claimed in claim 1, wherein the via structure comprises a conductor and an inner insulation layer, the conductor is disposed on the side wall of the groove, and the conductor defines a first central groove, the inner insulation layer is filled up the first central groove.

7. The semiconductor package as claimed in claim 1, wherein the via structure comprises an outer insulation layer and a conductor, the outer insulation layer is disposed on the side wall of the groove, and the outer insulation layer defines a second central groove, the conductor is filled up the second central groove.

8. The semiconductor package as claimed in claim 1, wherein the via structure comprises an outer insulation layer, a conductor and an inner insulation layer, the outer insulation layer is disposed on the side wall of the groove, and the outer insulation layer defines a second central groove, the conductor is disposed on the side wall of the second central groove, and the conductor defines a first central groove, the inner insulation layer is filled up the first central groove.

9. The semiconductor package as claimed in claim 1, further comprising at least one electrical device disposed on the second surface of the substrate, wherein the electrical device is a second inductor, a second capacitor or a second bump.

10. The semiconductor package according to claim 1, wherein the material of the first dielectric layer is Tantalum Pentoxide ($Ta_2O_5$).

11. The semiconductor package according to claim 1, wherein the material of the first upper electrode is AlCu.

12. The semiconductor package according to claim 1, wherein the second protective layer comprises at least one second opening, part of the second metal layer exposed on the second opening.

13. The semiconductor package according to claim 12, further comprising a first bump disposed in the second opening of the second protective layer and electrically connected to the second metal layer.

* * * * *